(12) United States Patent
Zhou et al.

(10) Patent No.: US 11,195,940 B2
(45) Date of Patent: Dec. 7, 2021

(54) HIGH-VOLTAGE TERAHERTZ STRAINED SIGE/INGAP HETEROJUNCTION BIPOLAR TRANSISTOR AND PREPARATION METHOD THEREOF

(71) Applicant: Yanshan University, Qinhuangdao (CN)

(72) Inventors: Chunyu Zhou, Qinhuangdao (CN); Zuowei Li, Qinhuangdao (CN); Guanyu Wang, Chongqing (CN); Xin Geng, Qinhuangdao (CN)

(73) Assignee: Yanshan University, Qinhuangdao (CN)

( * ) Notice: Subject to any disclaimer, the term of this patent is extended or adjusted under 35 U.S.C. 154(b) by 0 days.

(21) Appl. No.: 17/098,530

(22) Filed: Nov. 16, 2020

(65) Prior Publication Data

US 2021/0151587 A1   May 20, 2021

(30) Foreign Application Priority Data

Nov. 20, 2019   (CN) .......................... 201911141243.6

(51) Int. Cl.
*H01L 29/737* (2006.01)
*H01L 29/08* (2006.01)
(Continued)

(52) U.S. Cl.
CPC ........ *H01L 29/737* (2013.01); *H01L 29/0817* (2013.01); *H01L 29/0821* (2013.01);
(Continued)

(58) Field of Classification Search
CPC ............... H01L 29/737; H01L 29/0817; H01L 29/0821; H01L 29/1004; H01L 29/267; H01L 29/66318; H01L 29/7371
See application file for complete search history.

(56) References Cited

U.S. PATENT DOCUMENTS

| | | | |
|---|---|---|---|
| 7,875,523 B1 * | 1/2011 | Fields ................ | H01L 29/7371 438/343 |
| 8,435,852 B1 * | 5/2013 | Fields, Jr. .......... | H01L 29/0692 438/235 |

(Continued)

OTHER PUBLICATIONS

Skibitzki et al.—"GaP collector development for SiGe heterojunction bipolar transistor performance increase: A heterostructure growth study", J. Appl. Phys. 111, 073515 (2012); (Year: 2012).*

(Continued)

*Primary Examiner* — Syed I Gheyas
(74) *Attorney, Agent, or Firm* — IPro, PLLC

(57) ABSTRACT

This disclosure provides a high-voltage terahertz strained SiGe/InGaP heterojunction bipolar transistor and a preparation method thereof. An InGaP material has characteristics of a high carrier mobility of the InP material and a forbidden band width of the GaP material, so that the present disclosure employs the N-type $In_{1-x}Ga_xP$ layer as the collector to improve the frequency and power characteristics of the device, and realize the system integration of terahertz band chips. Further, the present disclosure utilizes the characteristics of the above materials and takes an advantages of "energy band engineering", uses the $In_{1-x}Ga_xP$ (x=0-1) is used as the material of the collector of the SiGe-HBT, the composition molar ratio X of In and Ga is appropriately selected, such that the materials SiGe of the collector and the sub-collector have the same lattice constant, so as to effectively improve interface characteristics of InGaP and SiGe materials.

8 Claims, 6 Drawing Sheets

(51) Int. Cl.
  *H01L 29/10*  (2006.01)
  *H01L 29/267*  (2006.01)
  *H01L 29/66*  (2006.01)

(52) U.S. Cl.
  CPC ........ *H01L 29/1004* (2013.01); *H01L 29/267* (2013.01); *H01L 29/66318* (2013.01)

(56) References Cited

U.S. PATENT DOCUMENTS

| | | | |
|---|---|---|---|
| 9,673,307 B1 * | 6/2017 | Chan | H01L 29/6625 |
| 2014/0110761 A1 * | 4/2014 | Yang | H01L 29/205 257/197 |
| 2014/0273323 A1 * | 9/2014 | Kim | H01S 5/3409 438/47 |
| 2019/0296131 A1 * | 9/2019 | Kim | H01L 29/267 |

OTHER PUBLICATIONS

Lew et al., InGaP/GaAs heterojunction bipolar transistor grown on Si substrate with SiGe graded buffer layer, Electronics Letters Jan. 31, 2008 vol. 44 No. 3 (Year: 2008).*

Loke, MOCVD growth of InGaP/GaAs heterojunction bipolar transistors on 200mm Si wafers for heterogeneous integration with Si CMOS, Semicond. Sci. Technol. 33 (2018) 115011 (Year: 2018).*

* cited by examiner

HIGH-VOLTAGE TERAHERTZ STRAINED SIGE/INGAP HETEROJUNCTION BIPOLAR TRANSISTOR AND PREPARATION METHOD THEREOF

TECHNICAL FIELD

The present disclosure relates to the technical field of a semiconductor integrated circuit, in particular to a high-voltage terahertz strained SiGe/InGaP heterojunction bipolar transistor and a preparation method thereof.

BACKGROUND

As the integrated circuit has stepped into an era of 5 nm, with further reduced feature size of the device, a breakthrough must be made in the foundational fields, such as device physics, materials, device structure, key processes, and integration technique and the like. Meanwhile, as a silicon-based circuit is applied in the field of a terahertz wave, high performance and low power consumption are increasingly required for a SiGe BiCMOS.

A SiGe heterojunction bipolar transistor (HBT) is made by adding a small amount of Ge composition into a base of a Si-based bipolar junction transistor (BJT). The base employs the SiGe material to significantly improve the device performance such that a SiGe HBT has already be a standard bipolar transistor in high-speed application. A UHF semiconductor device has two key parameters that are a cut-off frequency ($f_T$) and a maximum oscillation frequency ($f_{max}$). The heterojunction bipolar transistor (HBT) based on the SiGe process developed on the basis of a mature silicon process takes an advantage of "energy band engineering", and fundamentally settles a conflict between increasing amplification factor and improving frequency characteristics. At present, the SiGe HBT is widely used in high performance microwave radio frequency devices and circuits due to being completely compatible with the mature silicon process and that $f_T$ and $f_{max}$ can be close to or even comparable to III-V compounds HBT.

However, when the SiGe heterojunction bipolar transistor (HBT) works actively in a forward direction, a collector junction is at a reverse bias. In order to achieve the best device performance, it is required to allow greater current density to flow through the collector junction, at this time, an electric field of the collector junction is increased and a transmission time of carriers on the junction is decreased. Since the transmission time of the current carriers is determined by a saturation speed of the carriers in the material, the increase of the electric field can lead to avalanche breakdown effect caused by multiple collision ionization of the carriers in a collector, and since the avalanche multiplication factor largely depends on a forbidden band width of the material, in order to increase the cut-off frequency $f_T$ of the device, the avalanche breakdown voltage ($BV_{CEO}$) of a common-emitter collector function can be decreased, so that the high speed/high power performance of the SiGe-HBT are restricted.

SUMMARY

The technical problem to be solved by the present disclosure is to provide a device with frequency and power characteristics that simultaneously meet a system integration requirement of a terahertz band chip and a preparation method thereof.

In order to solve the above technical problems, the present disclosure proposes a high-voltage terahertz strained SiGe/InGaP heterojunction bipolar transistor, wherein the bipolar transistor is selected from an N-type doped single crystal Si substrate with a crystal orientation (001); an N-type SiGe layer with gradient Ge composition is epitaxially grown on the single crystal Si substrate, serving as a sub-collector, and N+ doping is performed on a right side region of the SiGe layer; a $SiO_2$ layer with a thickness of 1-2 microns is deposited on a surface of the SiGe layer to define a position of an active area; an N-type $In_{1-x}Ga_xP$ layer serving as a collector, a P-type SiGe layer serving as a base, and an intrinsic Si cap layer are sequentially and epitaxially grown in the active area; a nitride layer, an oxide layer and a sidewall oxide layer are sequentially deposited on the surfaces of the device, a polysilicon is deposited on the sidewall oxide layer as an emitter; the polysilicon layer are selectively and epitaxially grown, serving as an extrinsic base; a sidewall oxide layer of an extrinsic base is deposited; the emitter, the extrinsic base and the sub-collector are etched respectively, and a metal silicide is deposited to form an emitter contact, a base contact and a collector contact.

Preferably, a N-type $In_{1-x}Ga_xP$ is used as a material of the collector of a SiGe-HBT, and a composition molar ratio x of In and Ga is selected, that is 0≤x≤1, so that the materials of the collector and the sub-collector SiGe have the same lattice constant.

Preferably, a SiGe/Si structure heteroepitaxial N-type $In_{1-x}Ga_xP$ material is used as the collector.

Preferably, a method for employing MBE in the active area, by which the N-type $In_{1-x}Ga_xP$ layer serving as a collector, the P-type SiGe layer, and the intrinsic Si cap layer are sequentially and epitaxially grown.

A method for preparing a high-voltage terahertz strained SiGe/InGaP heterojunction bipolar transistor, comprising following steps:

step 1, selecting an initial material with monocrystalline silicon doping concentration $10^{15}$ cm$^{-3}$ and crystal orientation (001) as a substrate;

step 2, depositing an $SiO_2$ layer with a thickness of 50 nanometers on an N-type doped single crystal Si substrate;

step 3, photoetching the $SiO_2$ layer by using a mask 1, and then selectively epitaxially growing an N-type SiGe layer with a gradient Ge composition as a sub-collector of the heterojunction bipolar transistor, and the Ge composition on a top layer of the N-type SiGe layer is 20%;

step 4, by using a mask 2, performing ion implantation on a right side of the N-type SiGe layer in step 3 to form an N+ area;

step 5, depositing an $SiO_2$ layer with the thickness of 1-2 microns on an upper surface of the device obtained in step 4;

step 6, by using a mask 3, etching and defining a position of the active area, epitaxially growing the N-type $In_{1-x}Ga_xP$ layer as the collector, the P-type base SiGe layer and the intrinsic Si cap layer selectively and sequentially;

step 7, sequentially depositing a nitride layer and an oxide layer on the surface of the device formed in step 6, and etching the nitride layer and the oxide layer by using a mask 4 and a mask 5;

step 8, depositing the oxide layer on the surface of the device formed in step 7, and etching the oxide layer by using a mask 6 to form an EB sidewall oxide layer;

step 9, epitaxially growing an N+ polysilicon emitter on the oxide layer selectively, and forming an N+ emitter after CMP;

step 10, epitaxially growing an oxide layer on the surface of the device obtained in step 9 as a surface covering layer of the emitter;

step 11, etching the nitride layer in step 7, and then etching the oxide layer in step 8 by using a mask 7;

step 12, selectively depositing a P+ polysilicon layer on the upper surface of the device obtained in step 11, and etching the P+ polysilicon layer by using a mask 8 to form an extrinsic base of the device;

step 13, depositing an oxide layer on the upper surface of the device obtained in step 12, and etching the oxide layer deposited in this step by using a mask 9 to form a sidewall oxide layer;

step 14, etching the emitter, the extrinsic base and the sub-collector, and depositing a silicide to form a metal contact, thereby forming a collector contact, a base contact and an emitter contact.

Preferably, in step 6, using a method of MBE in the active area to perform selectively epitaxially growing.

Preferably, in step 6, a composition molar ratio of In and Ga is appropriately selected so that materials of the collector and the sub-collector have the same lattice constant.

Preferably, in step 6, using a SiGe/Si structure heteroepitaxial N-type $In_{1-x}Ga_xP$ material as a collector.

Compared with the prior art, the present disclosure has the following advantages:

Since a mobility of the carriers of an InP material is three times of Si, the InP material is used as the collector of a SiGe-HBT, to effectively reduce transmission time of a collector junction and further improve frequency characteristics of the device. Meanwhile, since a forbidden band width of a GaP material is twice of Si, the GaP material is used as the collector of the SiGe-HBT, to effectively reduce an avalanche multiplication factor, and further improve a breakdown voltage $BV_{CEO}$ of the device.

The present disclosure utilizes the characteristics of the above materials and takes an advantages of "energy band engineering", uses the $In_{1-x}Ga_xP$ (x=0-1) is used as the material of the collector of the SiGe-HBT, the composition molar ratio X of In and Ga is appropriately selected, such that the materials SiGe of the controller area and the sub-collector have the same lattice constant, so as to effectively improve interface characteristics of InGaP and SiGe materials. Therefore, using InGaP as a collector can improve the frequency and power characteristics of the device simultaneously, so that the device can realize a system integration of terahertz band chips.

Reference numbers are listed as follows: 100 N doped single crystal Si substrate, 101 $SiO_2$ layer, 102 SiGe sub-collector, 103 N+ doped area, 104 thick SiO2 layer, 105 InGaP collector, 106 P-type base SiGe layer, 107 Si cap layer, 108 nitride layer, 109 oxide layer, 110 sidewall oxide layer, 111 N+ emitter, 112 surface covering oxide layer, 113 etched oxide layer, 114 extrinsic base, 115 sidewall oxide layer, 116 emitter contact, 117 base contact, and 118 collector contact.

DETAILED DESCRIPTION

Hereinafter, the embodiments of the present disclosure will be described with reference to the drawings.

Figure 1:
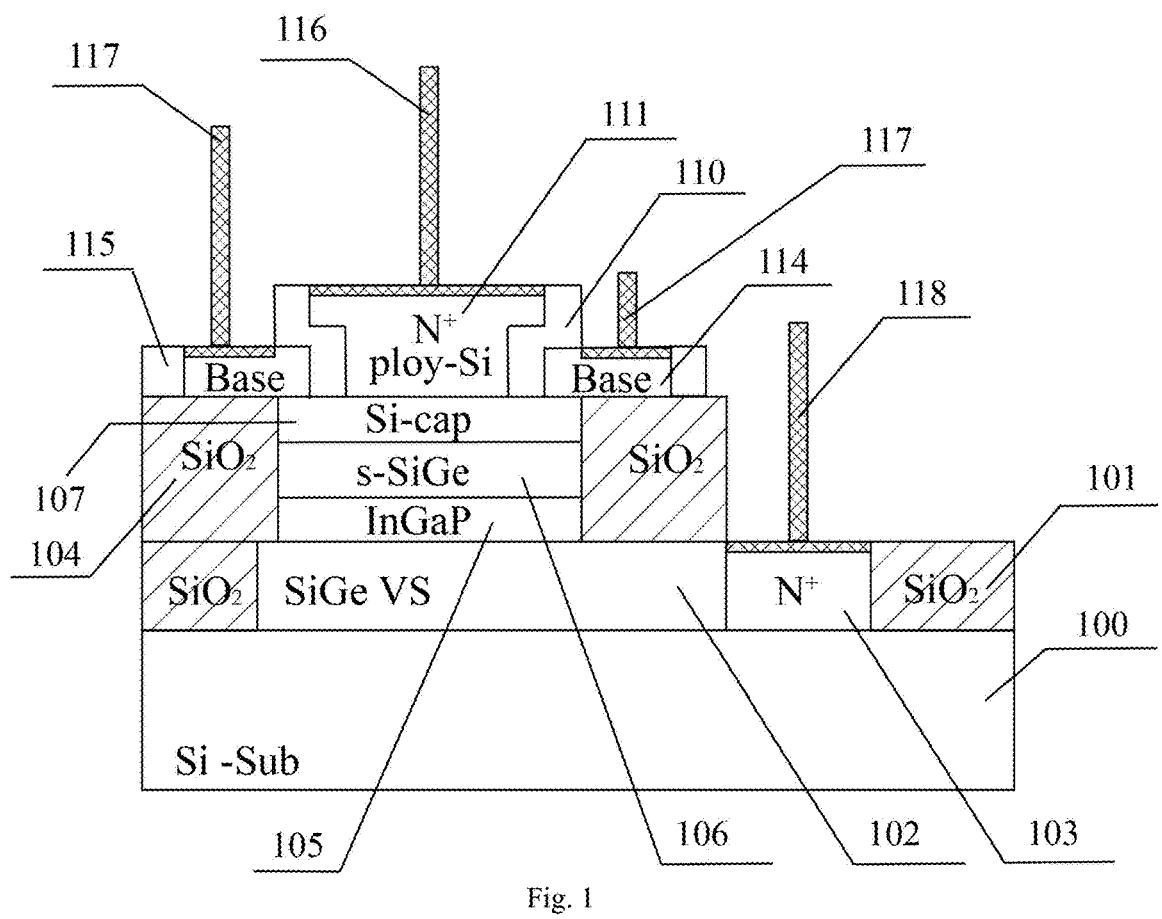
FIG. 1 is a schematic sectional view of an embodiment of the present disclosure.

As shown in FIG. 1, a high-voltage terahertz strained SiGe/InGaP heterojunction bipolar transistor of the present disclosure is provided. The bipolar transistor is selected from an N-type doped single crystal Si substrate with a crystal orientation (001); an N-type SiGe layer with gradient Ge composition is epitaxially grown on the substrate, serving as a sub-collector area, and N+ doping is performed on a right side region; a $SiO_2$ layer with a thickness of 1-2 microns is deposited on a surface of the SiGe layer to define a position of an active area; an N-type $In_{1-x}Ga_xP$ layer, a P-type SiGe layer, and an intrinsic Si cap layer are sequentially and epitaxially grown in the active area by using a method of MBE; a nitride layer, an oxide layer and a sidewall oxide layer are sequentially deposited on the surfaces of the device, a polysilicon is deposited on the sidewall oxide layer as an emitter area; the nitride is etched, and further the polysilicon layer are selectively and epitaxially grown, serving as an extrinsic base; a sidewall oxide layer of an extrinsic base is deposited; and finally, the emitter, the extrinsic base and the sub-collector are etched respectively to form an emitter contact, a base contact and a collector contact.

Figure 2:
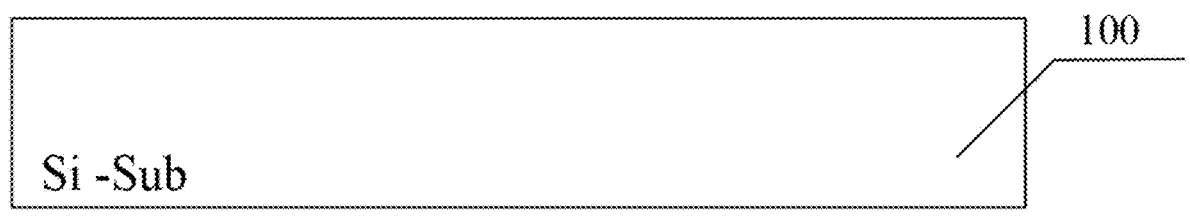
FIG. 2 is a schematic view of an N-type doped single crystal Si substrate in an embodiment of the present disclosure.
Figure 3:
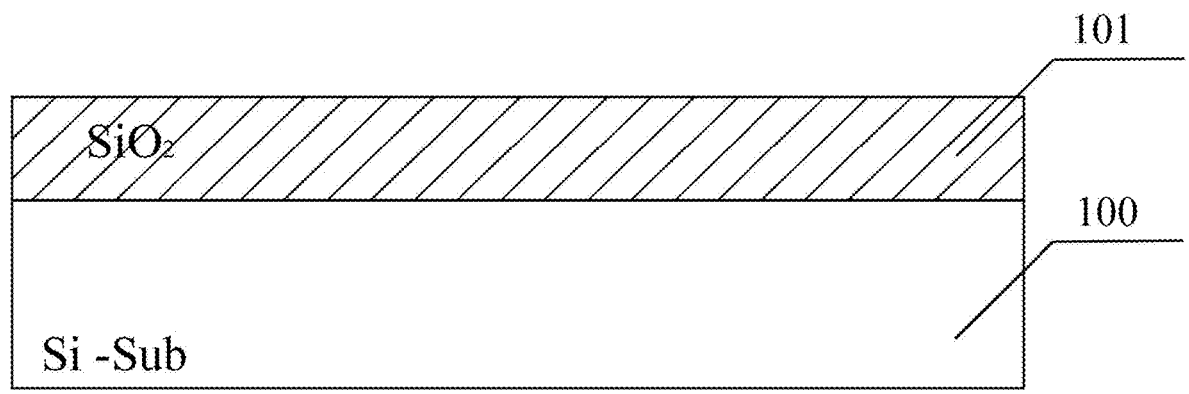
FIG. 3 is a schematic view of the device obtained in step 2 in an embodiment of the present disclosure.
Figure 4:
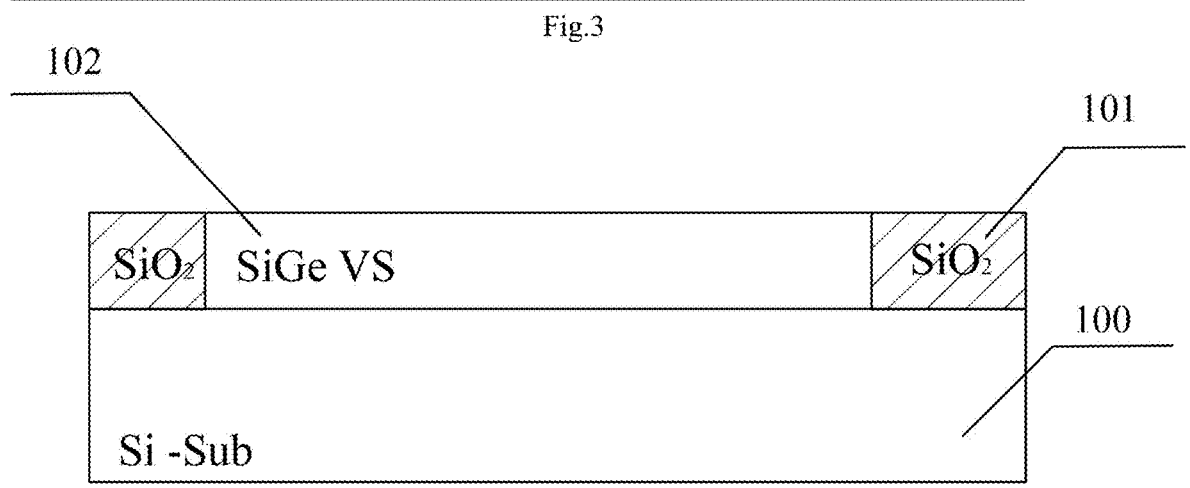
FIG. 4 is a schematic view of the device obtained in step 3 in an embodiment of the present disclosure.
Figure 5:
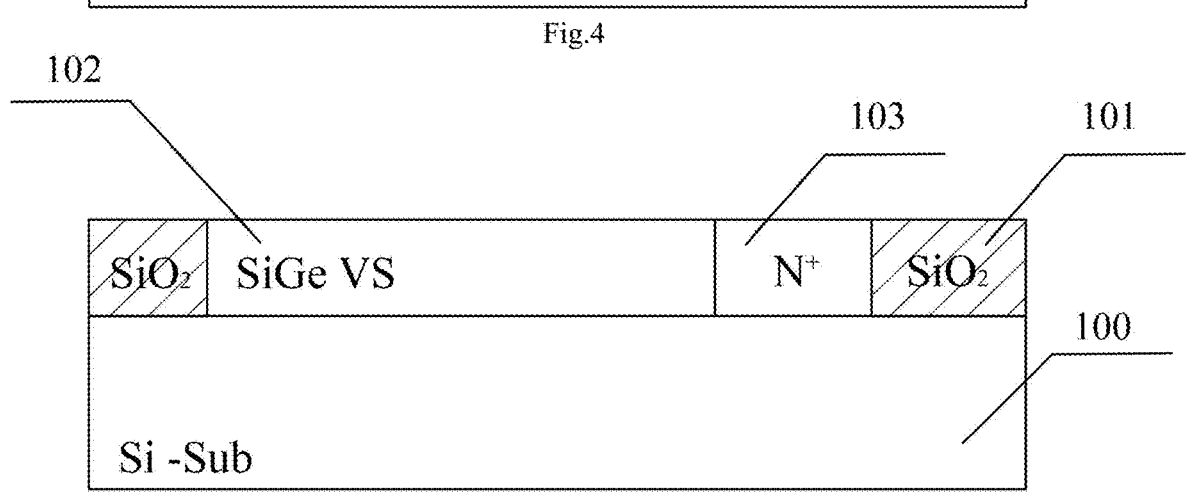
FIG. 5 is a schematic view of the device obtained in step 4 in an embodiment of the present disclosure.
Figure 6:
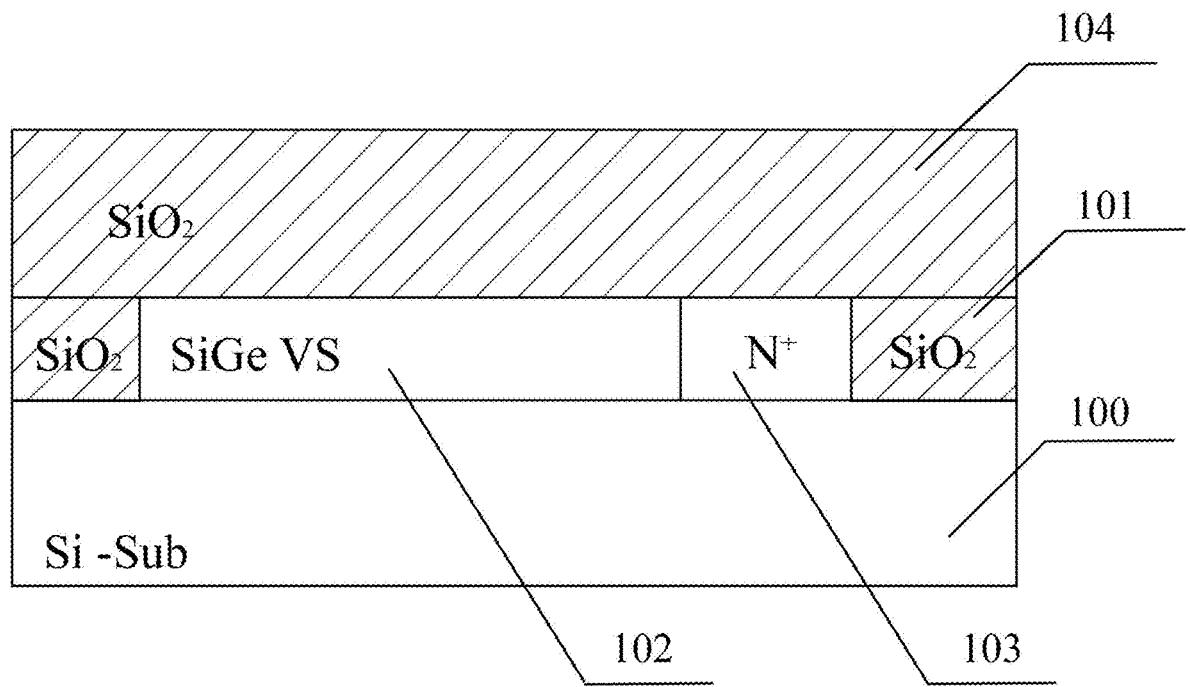
FIG. 6 is a schematic view of the device obtained in step 5 in an embodiment of the present disclosure.
Figure 7:
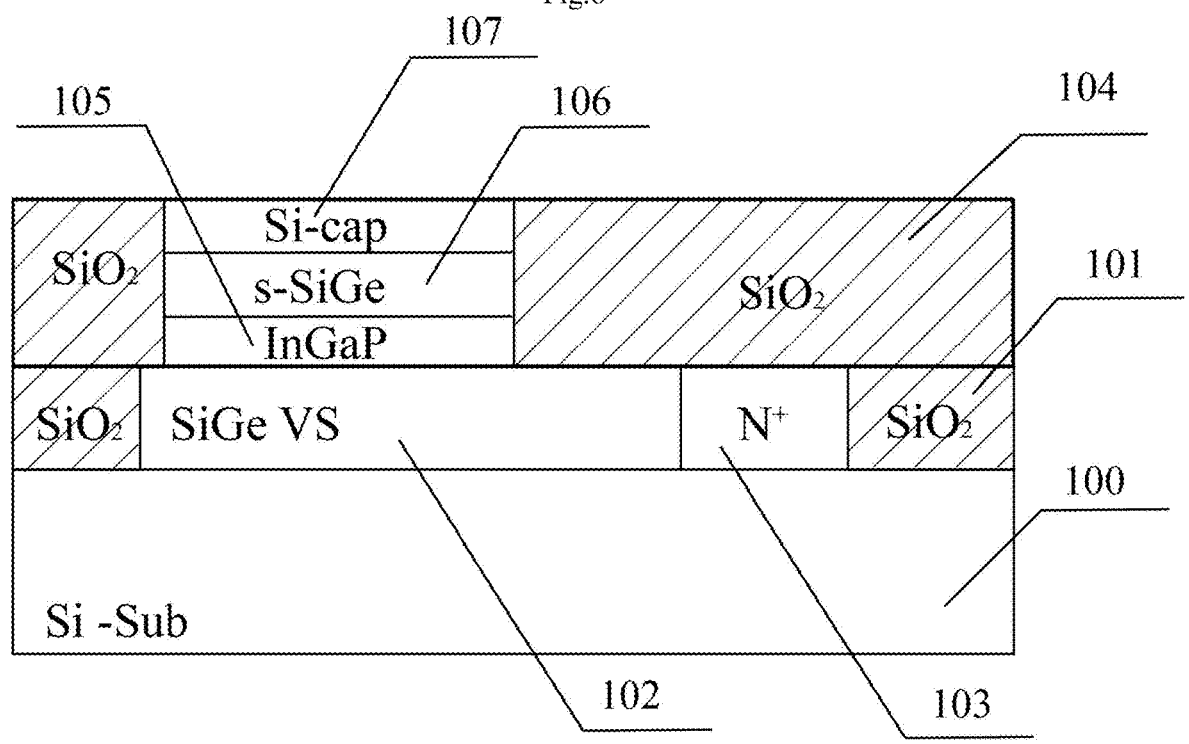
FIG. 7 is a schematic view of the device obtained in step 6 in an embodiment of the present disclosure.
Figure 8:
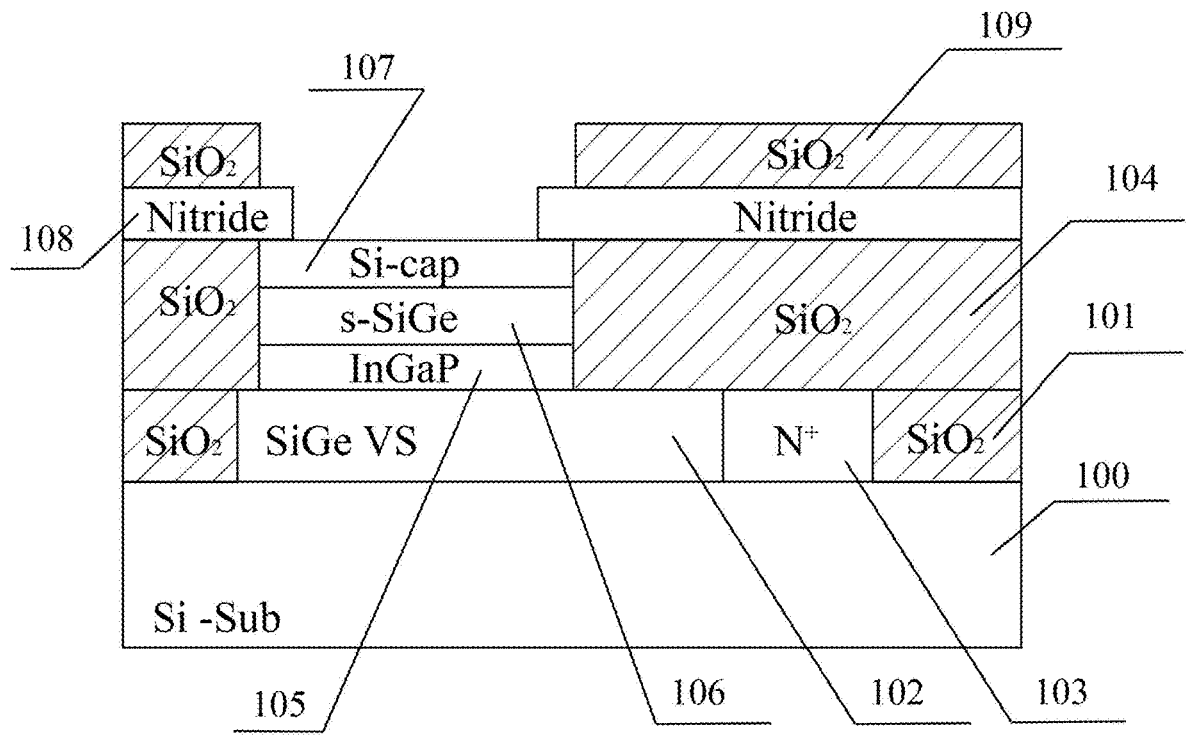
FIG. 8 is a schematic view of the device obtained in step 7 in an embodiment of the present disclosure.
Figure 9:
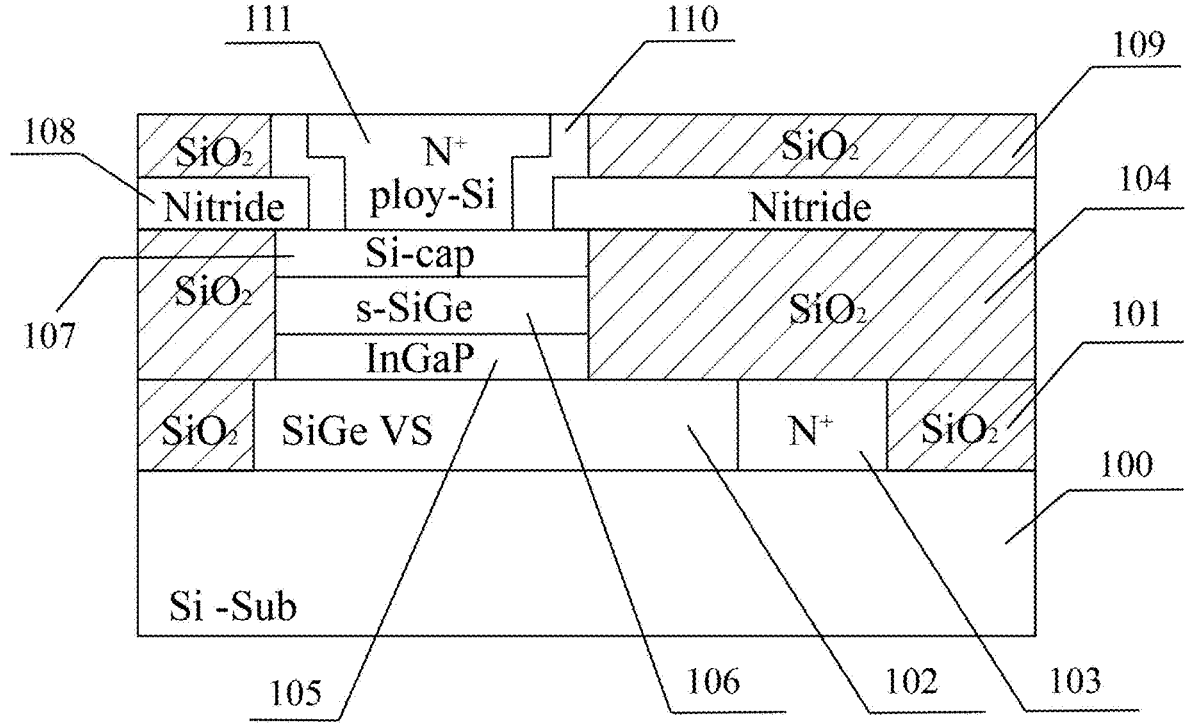
FIG. 9 is a schematic view of a device obtained after steps 8 and 9 in an embodiment of the present disclosure.
Figure 10:
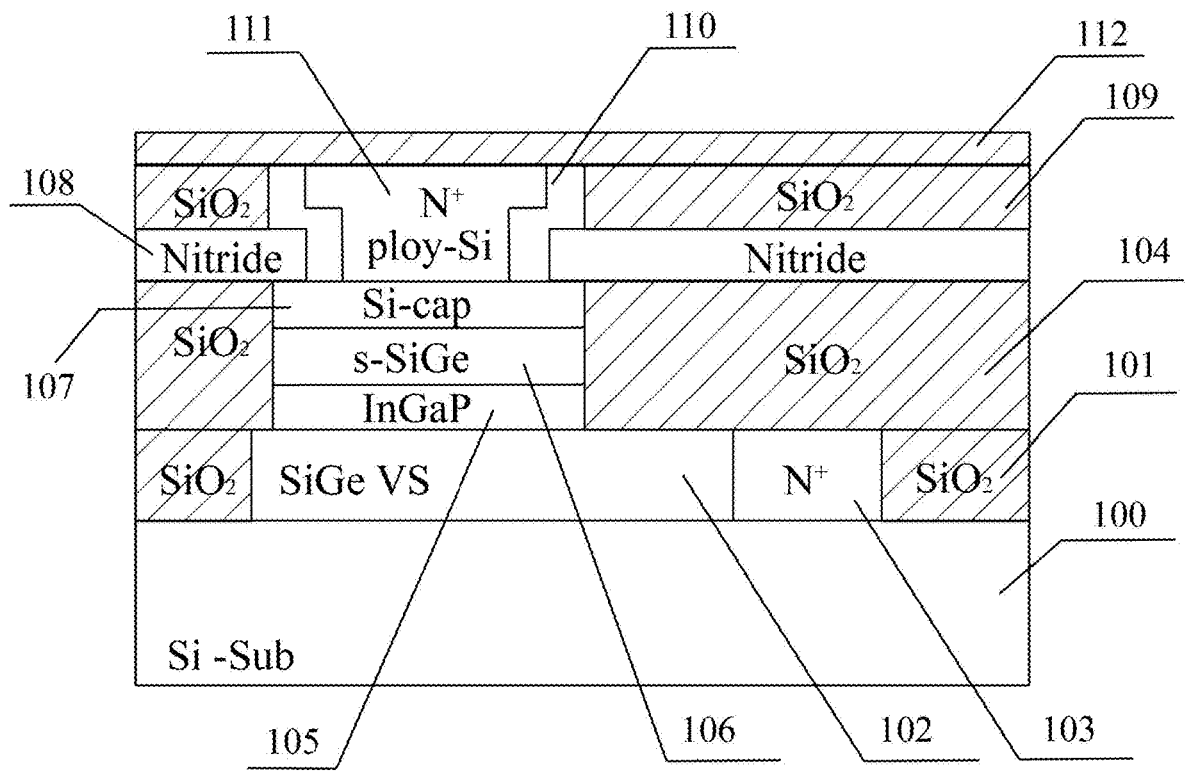
FIG. 10 is a schematic view of the device obtained in step 10 in an embodiment of the present disclosure.
Figure 11:
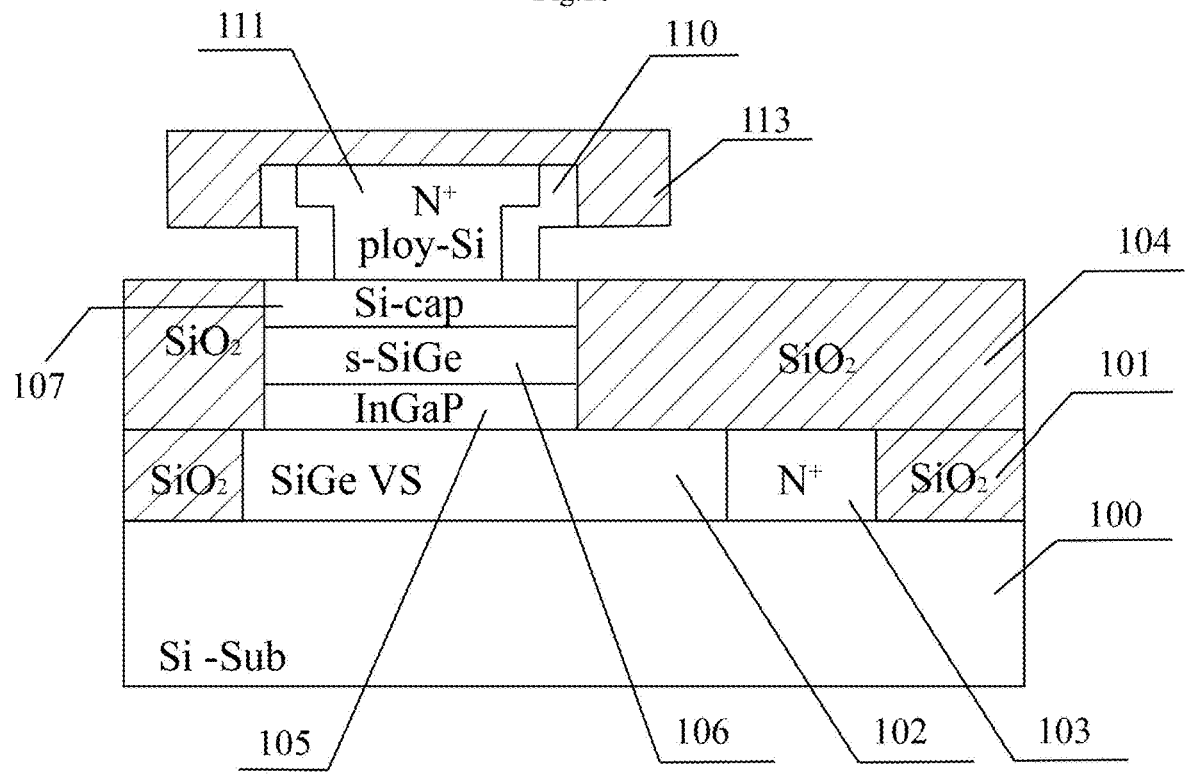
FIG. 11 is a schematic view of the device obtained in step 11 in an embodiment of the present disclosure.
Figure 12:
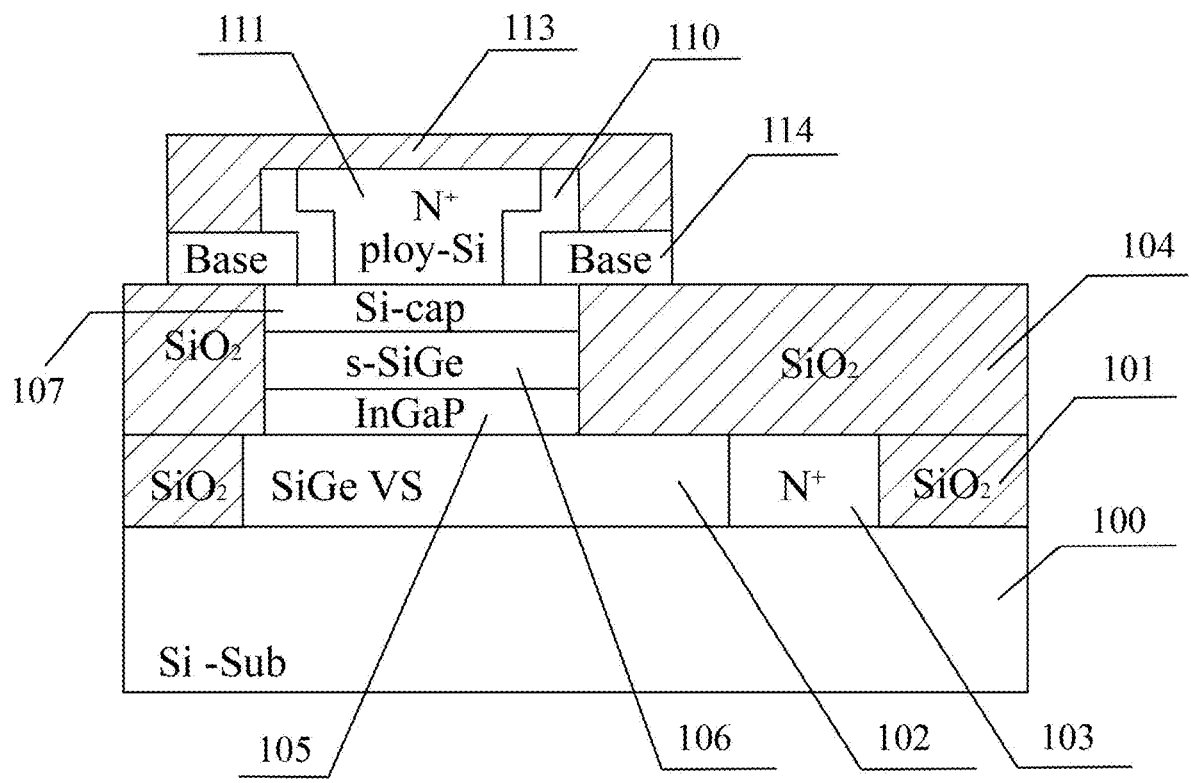
FIG. 12 is a schematic view of the device obtained in step 12 in an embodiment of the present disclosure.
Figure 13:
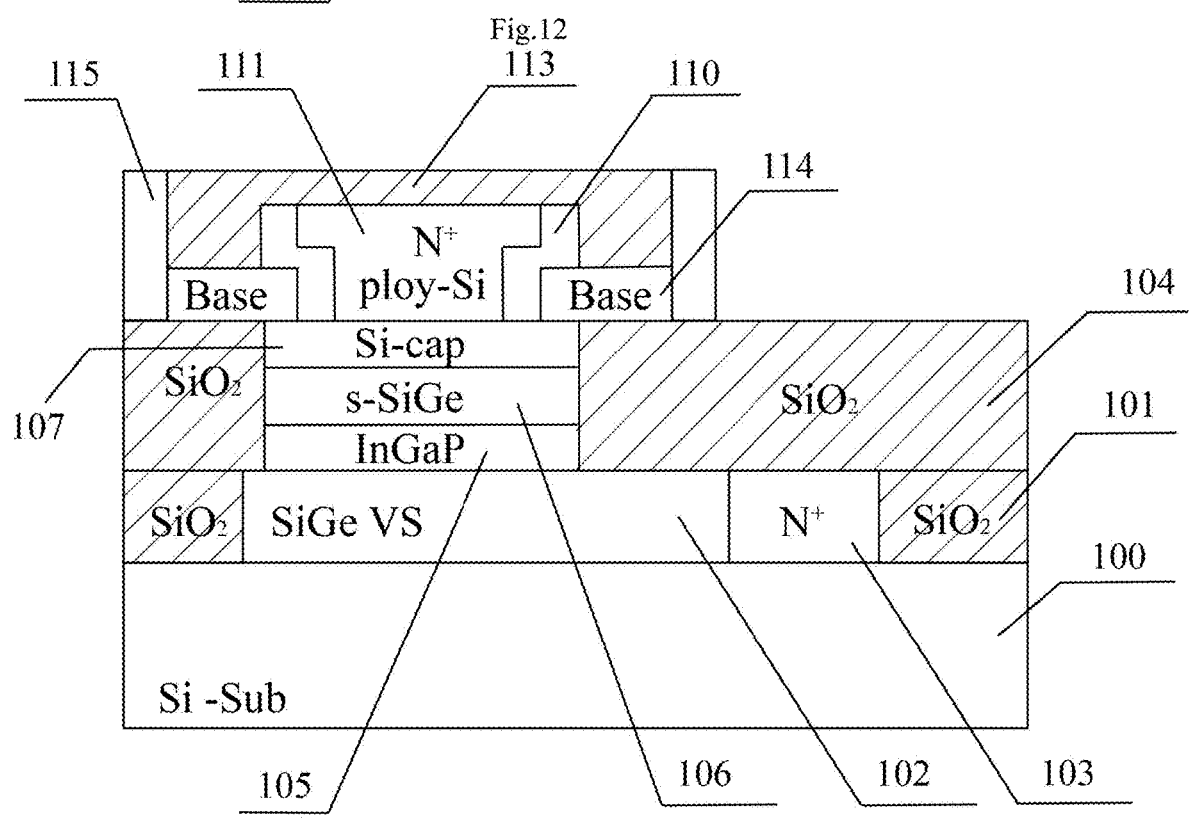
FIG. 13 is a schematic view of the device obtained in step 13 in an embodiment of the present disclosure.

A method for preparing a high-voltage terahertz strained SiGe/InGaP heterojunction bipolar transistor, the method includes following steps of:

step 1, providing an N-type doped single crystal Si substrate 100, as shown in FIG. 2; selecting an initial material with monocrystalline silicon doping concentration $10^{15}$ $cm^{-3}$ and crystal orientation (001) as a substrate;

step 2, depositing an $SiO_2$ layer 101 on the N-type doped single crystal Si substrate 100, as shown in FIG. 3;

step 3, photoetching the $SiO_2$ layer by using a mask 1, and then selectively epitaxially growing an N-type SiGe layer with a gradient Ge composition, in which the Ge composition on the top layer is 20%. The layer is used as a SiGe sub-collector 102 of the heterojunction bipolar transistor step 4, by using a mask 2, performing ion implantation on a right side of the SiGe layer to form an N+ doping area 103 for reducing a contact resistance of the controller electrode, as shown in FIG. 5;

step 5, depositing an $SiO_2$ layer 104, as shown in FIG. 6;

step 6, by using a mask 3, etching and defining a position of the active area, and then by using a MBE technology, epitaxially growing the N-type InGaP layer as an InGaP collector 105, the P-type base SiGe layer 106 and the intrinsic Si cap layer 107 selectively and sequentially, as shown in FIG. 7;

step 7, sequentially depositing a nitride layer 108 and an oxide layer 109 on the surface of the device formed in step 6, and etching the nitride layer 108 and the oxide layer 109 by using a mask 4 and a mask 5, as shown in FIG. 8;

step 8, depositing the oxide layer on the surface of the device formed in step 7, and etching the oxide layer by using a mask 6 to form an EB sidewall oxide layer 110, as shown in FIG. 9;

step 9, epitaxially growing an N+ polysilicon emitter on the oxide layer selectively, and forming an N+ emitter 111 as shown in FIG. 9 after CMP;

step 10, epitaxially growing an oxide layer on the upper surface of the device obtained in step 9 as a surface covering layer 112 of the emitter;

step 11, etching the nitride layer 108, and then etching the oxide layer 109 and the surface covering oxide layer 112 by using a mask 7, wherein the etched structure is the etched oxide layer 113, as shown in FIG. 11;

step 12, selectively depositing a P+ polysilicon layer, and etching the P+ polysilicon layer by using a mask 8 to form an extrinsic base 114 of the device, as shown in FIG. 12;

step 13, depositing an oxide layer, and etching the oxide layer by using a mask 9 to form a sidewall oxide layer 115, as shown in FIG. 13;

step 14, etching the N+ emitter 111, the extrinsic base and the sub-collector, and depositing a silicide to form a metal contact, thereby forming a collector contact 118, a base contact 117 and an emitter contact 116, as shown in FIG. 1.

The above-mentioned embodiments are merely described in the preferred implementations of the present disclosure, and do not limit the scope of the present disclosure. Various modifications and improvements made by those skilled in the art to the technical solution of the present disclosure without departing from the spirit of the present disclosure should fall within the scope of the present disclosure.

What is claimed is:

1. A high-voltage terahertz strained SiGe/InGaP heterojunction bipolar transistor, wherein the bipolar transistor is selected from an N-type doped single crystal Si substrate with a crystal orientation (001); an N-type SiGe layer with gradient Ge composition is epitaxially grown on the single crystal Si substrate, serving as a sub-collector, and N+ doping is performed on a right side region of the SiGe layer; a $SiO_2$ layer with a thickness of 1-2 microns is deposited on a surface of the SiGe layer to define a position of an active area; an N-type $In_{1-x}Ga_xP$ layer serving as a collector, a P-type SiGe layer serving as a base, and an intrinsic Si cap layer are sequentially and epitaxially grown in the active area; a nitride layer and an oxide layer are sequentially deposited on the surfaces of the $SiO_2$ layer with the thickness of 1-2 microns and the intrinsic Si cap layer and are etched, the oxide layer is re-deposited on the surfaces of the etched nitride layer and oxide layer and etched, to form a sidewall oxide layer; a polysilicon is deposited on the sidewall oxide layer as an emitter; the oxide layer is epitaxially grown on a surface of the device obtained as a surface covering oxide layer of the emitter, the surface covering oxide layer and the oxide layer on the nitride layer are etched, and the nitride layer is etched, the polysilicon layer are selectively and epitaxially grown at a position where the nitride is located and etched, serving as an extrinsic base; a sidewall oxide layer of an extrinsic base is deposited; the emitter, the extrinsic base and the sub-collector are etched respectively, and a metal silicide is deposited to form an emitter contact, a base contact and a collector contact.

2. The high-voltage terahertz strained SiGe/InGaP heterojunction bipolar transistor according to claim 1, wherein a N-type $In_{1-x}Ga_xP$ is used as a material of the collector of a SiGe-HBT, and a composition molar ratio x of In and Ga is selected, that is 0≤x≤1, so that the materials of the collector and the sub-collector SiGe have the same lattice constant.

3. The high-voltage terahertz strained SiGe/InGaP heterojunction bipolar transistor according to claim 1, wherein a SiGe/Si structure heteroepitaxial N-type $In_{1-x}Ga_xP$ material is used as the collector.

4. The high-voltage terahertz strained SiGe/InGaP heterojunction bipolar transistor according to claim 1, wherein a method for employing MBE in the active area, by which the N-type $In_{1-x}Ga_xP$ layer serving as a collector, the P-type SiGe layer, and the intrinsic Si cap layer are sequentially and epitaxially grown.

5. A method for preparing a high-voltage terahertz strained SiGe/InGaP heterojunction bipolar transistor, comprising following steps:

step 1, selecting an initial material with monocrystalline silicon doping concentration $10^{15}$ cm$^{-3}$ and crystal orientation (001) as a substrate;

step 2, depositing an $SiO_2$ layer with a thickness of 50 nanometers on an N-type doped single crystal Si substrate;

step 3, photoetching the $SiO_2$ layer by using a mask 1, and then selectively epitaxially growing an N-type SiGe layer with a gradient Ge composition as a sub-collector of the heterojunction bipolar transistor, and the Ge composition on a top layer of the N-type SiGe layer is 20%;

step 4, by using a mask 2, performing ion implantation on a right side of the N-type SiGe layer in step 3 to form an N+ area;

step 5, depositing an $SiO_2$ layer with the thickness of 1-2 microns on an upper surface of the device obtained in step 4;

step 6, by using a mask 3, etching and defining a position of the active area, epitaxially growing the N-type $In_{1-x}Ga_xP$ layer as the collector, the P-type base SiGe layer and the intrinsic Si cap layer selectively and sequentially;

step 7, sequentially depositing a nitride layer and an oxide layer on the surface of the device formed in step 6, and etching the nitride layer and the oxide layer by using a mask 4 and a mask 5;

step 8, depositing the oxide layer on the surface of the device formed in step 7, and etching the oxide layer by using a mask 6 to form an EB sidewall oxide layer;

step 9, epitaxially growing an N+ polysilicon emitter on the oxide layer selectively, and forming an N+ emitter after CMP;

step 10, epitaxially growing an oxide layer on the surface of the device obtained in step 9 as a surface covering layer of the emitter;

step 11, etching the nitride layer in step 7, and then etching the oxide layer in step 8 by using a mask 7;

step 12, selectively depositing a P+ polysilicon layer on the upper surface of the device obtained in step 11, and etching the P+ polysilicon layer by using a mask 8 to form an extrinsic base of the device;

step 13, depositing an oxide layer on the upper surface of the device obtained in step 12, and etching the oxide layer deposited in this step by using a mask 9 to form a sidewall oxide layer;

step 14, etching the emitter, the extrinsic base and the sub-collector, and depositing a silicide to form a metal contact, thereby forming a collector contact, a base contact and an emitter contact.

6. The method for preparing the high voltage terahertz strained SiGe/InGaP heterojunction bipolar transistor according to claim 5, wherein in step 6, using a method of MBE in the active area to perform selectively epitaxially growing.

7. The method for preparing the high voltage terahertz strained SiGe/InGaP heterojunction bipolar transistor according to claim 5, wherein in step 6, a composition molar ratio of In and Ga is appropriately selected so that materials of the collector and the sub-collector have the same lattice constant.

8. The method for preparing the high voltage terahertz strained SiGe/InGaP heterojunction bipolar transistor according to claim 5, wherein in step 6, using a SiGe/Si structure heteroepitaxial N-type $In_{1-x}Ga_xP$ material as a collector.

* * * * *